(12) United States Patent
Faune et al.

(10) Patent No.: US 11,024,490 B2
(45) Date of Patent: Jun. 1, 2021

(54) MAGNETRON HAVING ENHANCED TARGET COOLING CONFIGURATION

(71) Applicant: APPLIED MATERIALS, INC., Santa Clara, CA (US)

(72) Inventors: Vanessa Faune, San Jose, CA (US); William R. Johanson, Gilroy, CA (US); Kirankumar Neelasandra Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 75 days.

(21) Appl. No.: 16/213,805

(22) Filed: Dec. 7, 2018

(65) Prior Publication Data

US 2019/0180992 A1 Jun. 13, 2019

Related U.S. Application Data

(60) Provisional application No. 62/597,397, filed on Dec. 11, 2017.

(51) Int. Cl.
*H01J 37/34* (2006.01)
*H01F 7/06* (2006.01)

(52) U.S. Cl.
CPC .......... *H01J 37/3497* (2013.01); *H01F 7/06* (2013.01); *H01J 37/3405* (2013.01); *H01J 37/3455* (2013.01)

(58) Field of Classification Search
CPC . H01J 37/3497; H01J 37/3455; H01J 37/3405
USPC ............... 204/298.09, 298.11, 298.19, 298.2
See application file for complete search history.

(56) References Cited

U.S. PATENT DOCUMENTS

| 4,746,417 A | * | 5/1988 | Ferenbach | C23C 14/35 204/192.12 |
| 6,183,614 B1 | | 2/2001 | Fu | |
| 6,328,856 B1 | * | 12/2001 | Brucker | C23C 14/3407 204/192.12 |
| 6,406,599 B1 | | 6/2002 | Subramani et al. | |
| 2003/0217913 A1 | * | 11/2003 | Hong | C23C 14/355 204/192.12 |
| 2009/0090620 A1 | * | 4/2009 | Pavloff | H01J 37/3405 204/298.13 |
| 2012/0027954 A1 | * | 2/2012 | Liu | H01J 37/3405 427/571 |

(Continued)

FOREIGN PATENT DOCUMENTS

JP 2003-089872 * 3/2003

OTHER PUBLICATIONS

Machine Translation 2003-089872 dated Mar. 2003 (Year: 2003).*

*Primary Examiner* — Rodney G McDonald
(74) *Attorney, Agent, or Firm* — Moser Taboada (57) ABSTRACT

Embodiments of magnetron assemblies and processing systems incorporating same are provided herein. In some embodiments, a magnetron assembly includes a rotatable magnet assembly coupled to a bottom of the body and having a plurality of magnets spaced apart from each other; and an encapsulating body disposed in a space between the plurality of magnets. In some embodiments, the magnetron assembly further includes a body extending along a central axis of the magnetron assembly and having a coolant feedthrough channel to provide a coolant to an area beneath the body.

20 Claims, 3 Drawing Sheets

(56) References Cited

U.S. PATENT DOCUMENTS

2015/0048735 A1* 2/2015 West ............... H01J 37/345
                                                315/39.71
2019/0019658 A1   1/2019 Wysok et al.

* cited by examiner

MAGNETRON HAVING ENHANCED TARGET COOLING CONFIGURATION

CROSS-REFERENCE TO RELATED APPLICATIONS

This application claims benefit of U.S. provisional patent application Ser. No. 62/597,397, filed Dec. 11, 2017 which is herein incorporated by reference in its entirety.

FIELD

Embodiments of the present disclosure generally relate to magnetrons for use in physical vapor deposition chambers for substrate processing.

BACKGROUND

Sputtering, alternatively called physical vapor deposition (PVD), has long been used in depositing metals and related materials in the fabrication of semiconductor integrated circuits. Use of PVD has been extended to depositing metal layers onto the sidewalls of high aspect-ratio holes such as vias or other vertical interconnect structures. Currently, advanced sputtering applications include depositing materials having high stress and high ion density into such vias.

For example, titanium, tantalum, and the like have been used in through silicon via (TSV) applications. The inventors have observed that in such applications and other applications using other target materials where a high stress target material and, thus, high power, are utilized, the target begins to crack and bow due to high target temperatures and insufficient cooling. Although a coolant has been used to cool the backside of the target assembly, the inventors have observed that the coolant flowing into the cavity in which the magnetron is disposed does not sufficiently cool the target in certain applications.

Thus, the inventors have provided an improved magnetron assembly that can address the above-described issues.

SUMMARY

Embodiments of magnetron assemblies and processing systems incorporating same are provided herein. In some embodiments, a magnetron assembly includes a rotatable magnet assembly coupled to a bottom of the body and having a plurality of magnets spaced apart from each other; and an encapsulating body disposed in a space between the plurality of magnets. In some embodiments, the magnetron assembly further includes a body extending along a central axis of the magnetron assembly and having a coolant feedthrough channel to provide a coolant to an area beneath the body.

In some embodiments, a substrate processing system includes a chamber, a lid removably disposed atop the chamber, a target assembly coupled to the lid, the target assembly including a target material to be sputtered from the target assembly and deposited on a substrate, a substrate support disposed within the chamber to support a substrate during processing, a coolant supply, and a magnetron assembly as described in any of the embodiments herein. In some embodiments, the magnetron assembly can include a body extending along a central axis of the magnetron assembly and having a coolant feedthrough channel to provide a coolant to an area beneath the body, a rotatable magnet assembly coupled to a bottom of the body, the rotatable magnet assembly having a shunt plate, an outer loop of magnets coupled to a first surface of the shunt plate, and an inner loop of magnets coupled to the first surface of the shunt plate, and an encapsulating body disposed in a space between within the inner loop of magnets and between the outer loop of magnets and the inner loop of magnets, wherein the magnetron assembly is disposed adjacent the target assembly and the coolant feedthrough channel is configured to provide the coolant from the coolant supply along the central axis to a gap between the encapsulating body and the target assembly to cool the target assembly.

In some embodiments, a magnetron assembly includes a body extending along a central axis of the magnetron assembly and having a coolant feedthrough channel to provide a coolant to an area beneath the body; and a rotatable magnet assembly coupled to a bottom of the body, the rotatable magnet assembly having a shunt plate, an outer loop of magnets coupled to a first surface of the shunt plate, and an inner loop of magnets coupled to the first surface of the shunt plate; and an encapsulating body disposed in a space between the outer loop of magnets and the inner loop of magnets, wherein the encapsulating body includes a through hole aligned with the coolant feedthrough channel.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to a magnetron assembly having an encapsulating body disposed in a space between the magnets of the magnetron assembly, which advantageously improves cooling of a target assembly disposed beneath the magnetron assembly. The inventive magnetron assembly advantageously forces the coolant to across the backplate of the target assembly as opposed to other spaces, thus increasing the effective cooling area. The inventive magnetron advantageously alleviates failure of the target due to overheating.

Figure 1:
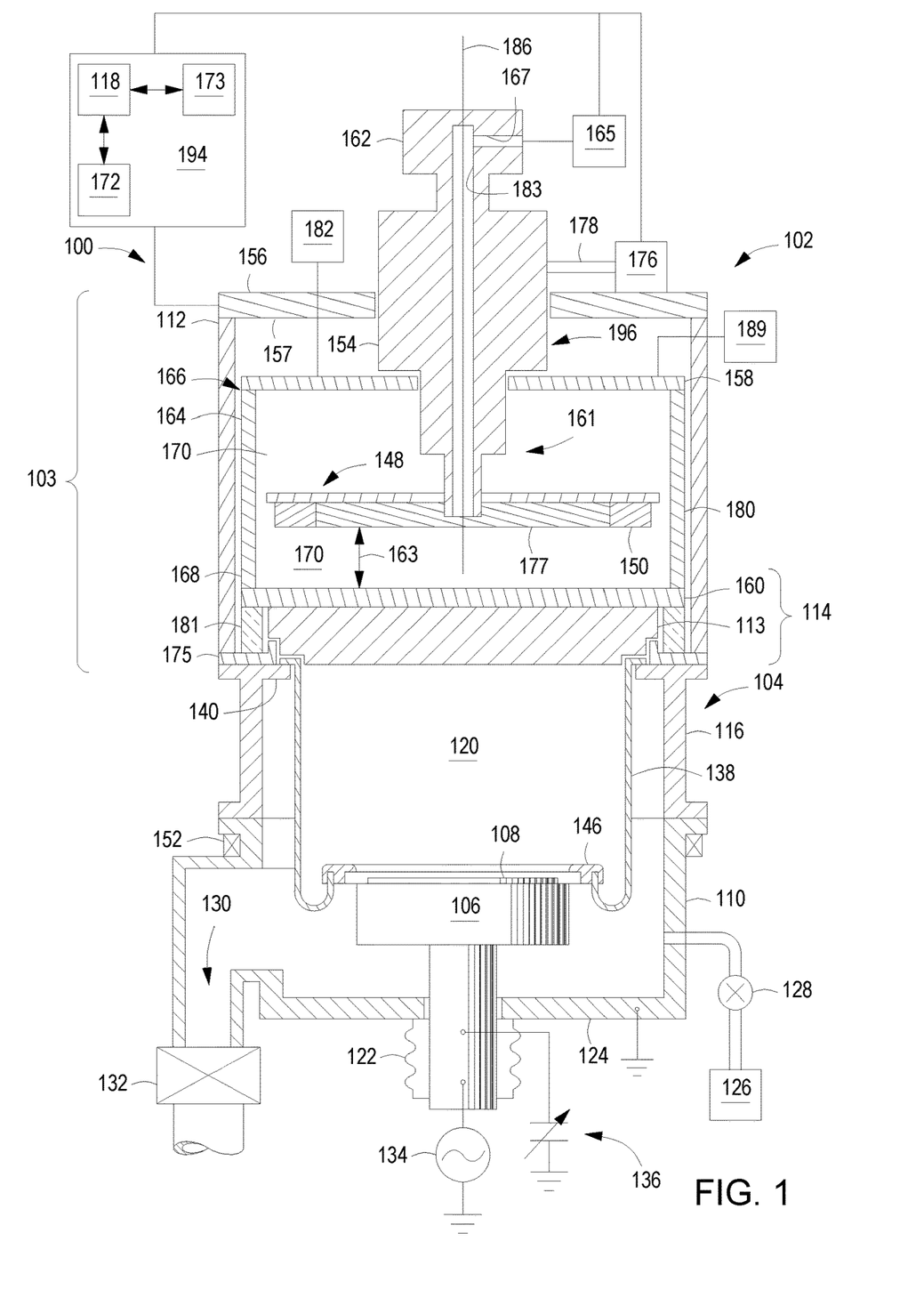
FIG. 1 depicts a schematic cross-sectional view of a process chamber in accordance with some embodiments of the present disclosure.

FIG. 1 depicts a simplified, cross-sectional view of a substrate processing system (e.g., physical vapor deposition (PVD) processing system 100) in accordance with some embodiments of the present disclosure. Examples of other PVD chambers suitable for modification in accordance with the teachings provided herein include the VENTURA® and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

For illustration, the PVD processing system 100 includes a chamber lid 102 removably disposed atop a process chamber 104. The chamber lid 102 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate 160).

The magnetron assembly 196 provides a rotating magnetic field proximate the target to assist in plasma processing within the process chamber 104. The magnetron assembly 196 includes a body 154, a motor 176 coupled to the body 154 via a coupling assembly 178 (e.g., a gear assembly), and a rotatable magnet assembly 148 coupled to a lower portion of the body 154 and disposed within the cavity 170. The rotatable magnet assembly 148 includes a plurality of magnets 150. The motor 176 and coupling assembly 178 are configured to rotate the body 154, the rotatable magnet assembly 148 and the plurality of magnets 150 about a central axis 186 of the process chamber 104. The motor 176 may be an electric motor, a pneumatic or hydraulic drive, or any other process-compatible mechanism that can provide the required movement. While one illustrative embodiment is described herein to illustrate how the rotatable magnet assembly 148 may be rotated, other configurations may also be used. The body 154 includes a coolant feedthrough channel 183 to provide a coolant along the central axis 186 to an area beneath the body 154. The coolant feedthrough channel 183 extends through the body 154 along the central axis 186. The coolant feedthrough channel 183 extends along the central axis 186 from a manifold portion 162 through a lower portion 161 of the body 154. A coolant supply 165 is fluidly coupled to an inlet 167 of the manifold portion 162 to supply a coolant through the coolant feedthrough channel 183 and into the cavity 170 to an area beneath the magnet assembly 148

In use, the magnetron assembly 196 rotates and, in some embodiments, vertically moves the rotatable magnet assembly 148 within the cavity 170. In some embodiments, the coupling assembly 178 may be a belt that includes ridges which mate with grooves disposed in the motor 176 and the body 154 to transfer the rotational motion provided by the motor 176 to the rotatable magnet assembly 148. In some embodiments, the coupling assembly 178 may alternatively be coupled to the rotatable magnet assembly 148 through the use of pulleys, gears, or other suitable means of transferring the rotational motion provided by the motor 176.

The inventors have discovered that coolant supplied through a central coolant feedthrough channel is free to travel anywhere in the cavity 170. Specifically, coolant flows in a space between magnets instead of only across the back surface of the target assembly 114. As a result, the target can become excessively hot, leading to failure of the target. The inventors have discovered that if the space between the magnets is occupied, the coolant is forced to flow between a bottom face of the magnet assembly and the back surface of the target assembly, thus improving cooling of the target assembly. For example, at 55 kilowatts of power, a temperature of the target is assembly is reduced by about 35° C. compared to conventional cooling means with open spaces between the magnets. As such, the improved magnetron assembly 196 provided by the inventors includes an encapsulating body 177 occupying a space between the plurality of magnets 150. Because the encapsulating body 177 occupies the space between the plurality of magnets 150, coolant cannot flow in the space between the plurality of magnets 150 and is forced to flow in an area between the magnet assembly 148 and the target assembly 114, thus increasing the effective cooling of the target assembly 114. In some embodiments, a distance 163 between a lowermost surface of the encapsulating body 177 and the backing plate 160 is between about 1 mm and about 2 mm.

Figure 2A:
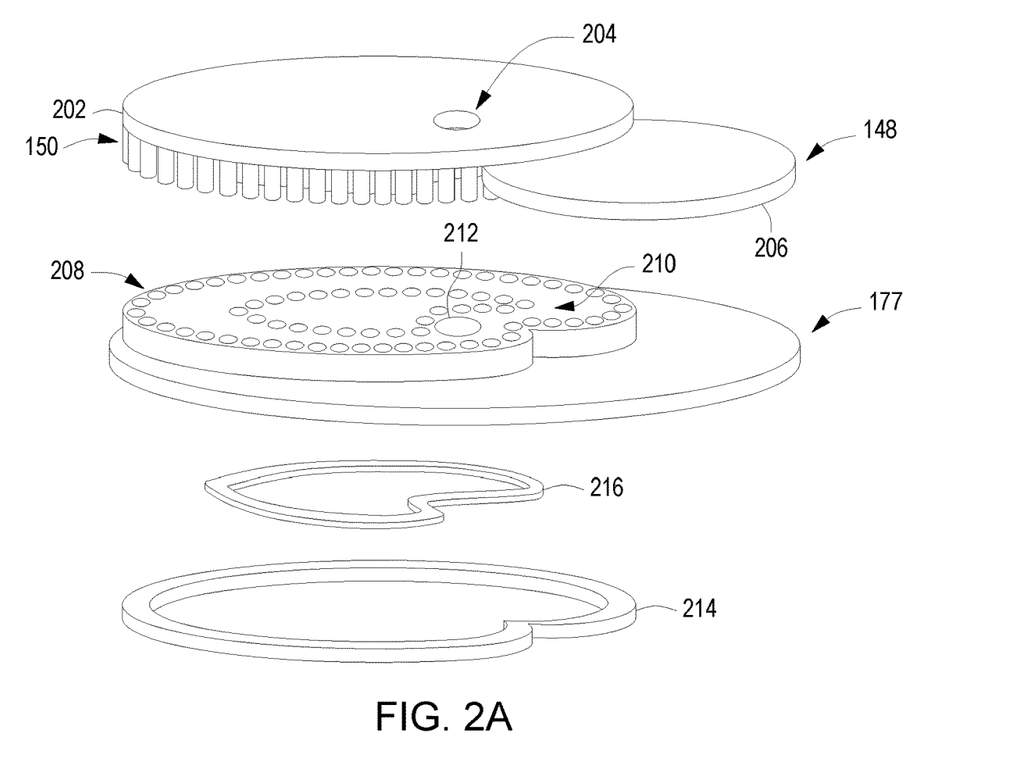
FIG. 2A depicts an exploded isometric view of a magnet assembly in accordance with some embodiments of the present disclosure.
Figure 2B:
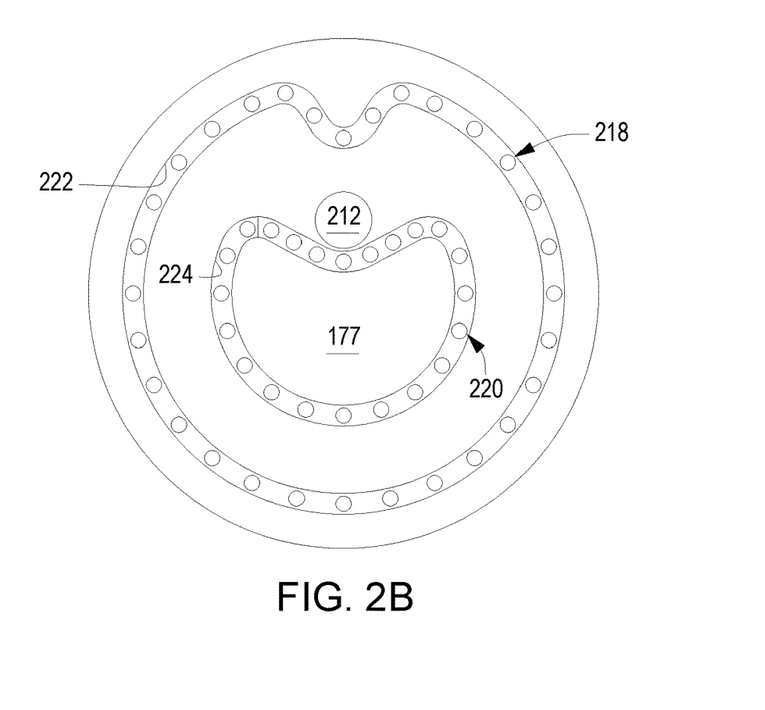
FIG. 2B depicts a bottom schematic view of the magnet assembly 148 in accordance with some embodiments of the present disclosure.

The following description will be made with reference to FIGS. 2A and 2B. FIG. 2A depicts an exploded isometric view of a magnet assembly (e.g., magnet assembly 148 including encapsulating body 177) in accordance with some embodiments of the present disclosure. FIG. 2B depicts a bottom schematic view of the magnet assembly 148 in accordance with some embodiments of the present disclosure. As depicted in FIG. 2A, the plurality of magnets 150 are coupled to a shunt plate 202 having an opening 204, which, when coupled to the bottom of the body 154, allows coolant to pass. A counterbalance 206 is coupled to the shunt plate 202 to provide a counterweight as the magnet assembly 148 rotates.

The encapsulating body 177 is configured to occupy the spaces between the plurality of magnets 150. In some embodiments, the encapsulating body 177 can be coupled to the shunt plate 202 and has an overall thickness approximately equal to that of the plurality of magnets 150. As such, a bottom surface of the encapsulating body 177 and the bottom surfaces of the plurality of magnets 150 form a substantially planar surface. In some embodiments, the plurality of magnets 150 may protrude slightly beyond or may be recessed slightly with respect to the bottom surface of the encapsulating body 177. By occupying the spaces between the plurality of magnets. A through hole 212 is disposed through the encapsulating body 177 in a position alighted with the opening 204 to allow coolant to pass in an area beneath the encapsulating body 177.

In some embodiments, the encapsulating body 177 may be formed externally (e.g., in a mold) and a plurality of holes 208, 210 corresponding to the plurality of magnets 150 may be formed through the encapsulating body 177. Alternatively or in combination, in some embodiments, the encapsulating body 177 may have a plurality of slots (not shown) to receive a corresponding plurality of groups of the plurality of magnets 150. Subsequently, the encapsulating body 177 is placed into place with the plurality of magnets 150 extending through the plurality of holes 208, 210. In some embodiments, the encapsulating body 177 may alternatively be formed in the spaces between the plurality of magnets 150 to fill the spaces. In such an embodiments, the holes 208, 210 are the portions of the encapsulating body 177 occupied by the plurality of magnets 150. In some embodiments, a tube (not shown) may alternatively extend from the opening 204 to the hole 212 and the encapsulating body 177 may only block off a lowermost portion of the space between the plurality of magnets, leaving a space between the encapsulating body 177 and the shunt plate 202.

The encapsulating body 177 is formed of a non-magnetic, or non-ferrous, material that does not corrode or react with the coolant. In some embodiments, the material of the encapsulating body 177 is also lightweight. In some embodiments, the encapsulating body 177 may be formed of one of polyoxymethylene, epoxy, or a foam epoxy hybrid. In some embodiments, the encapsulating body 177 may be formed of aluminum (Al), or the like.

In some embodiments, the magnet assembly 148 further includes an outer magnetic pole plate 214 coupled to an outer loop of magnets 218 (shown in FIG. 2B) and an inner magnetic pole plate 216 coupled to an inner loop of magnets 220 (shown in FIG. 2B). To accommodate the outer and inner magnetic pole plates 214, 216, the encapsulating body 177 includes corresponding outer and inner pole plate channels 222, 224, respectively. FIG. 2B depicts the magnet assembly 148 without the outer and inner magnetic pole plates 214, 216 coupled to the plurality of magnets. As depicted in FIG. 2B, the encapsulating body 177 fills the space within the inner loop of magnets 220 and the space between the outer and inner loop of magnets 218, 220.

Figure 3:
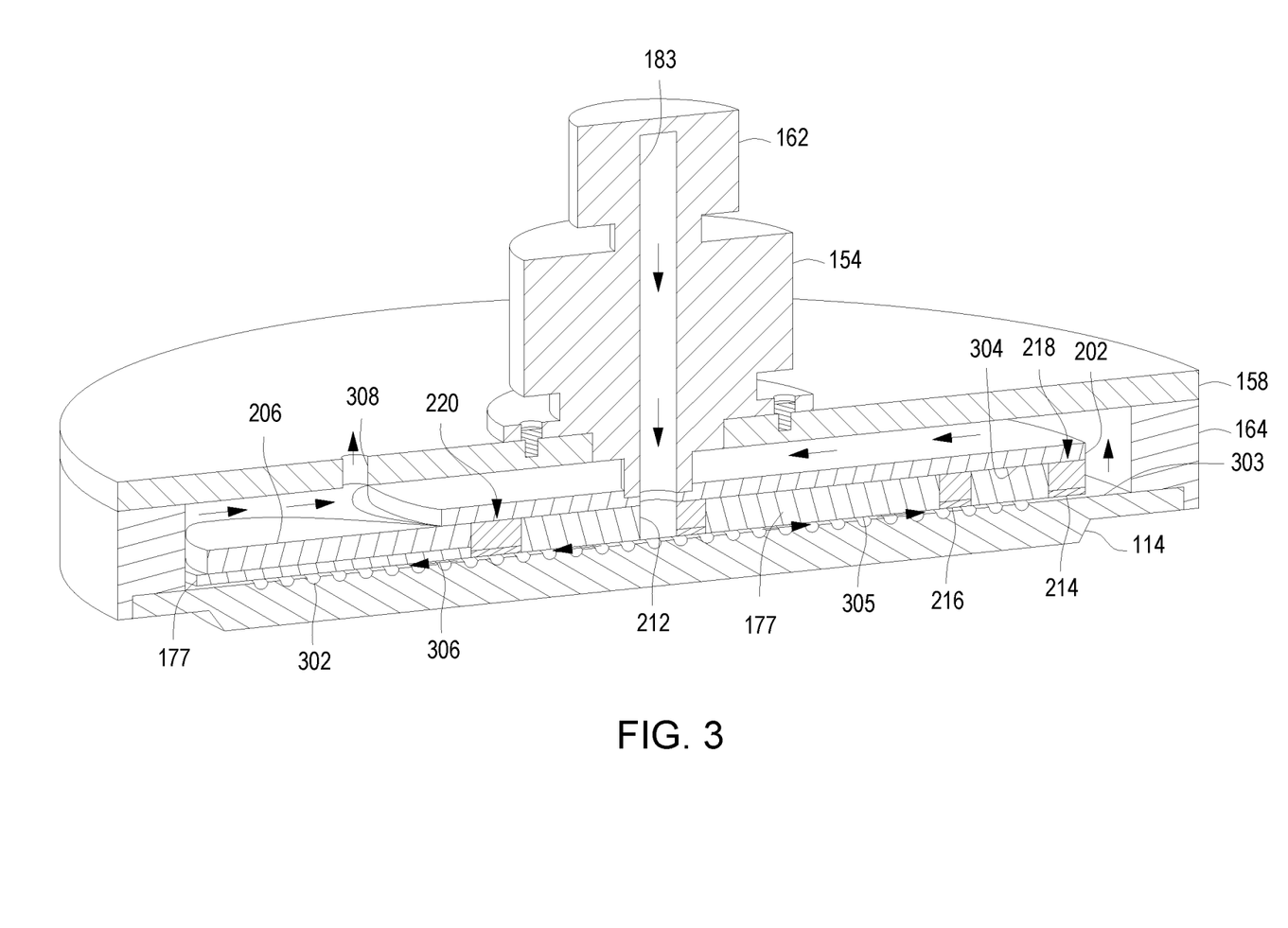
FIG. 3 depicts a schematic cross-sectional view of a magnetron assembly in accordance with some embodiments of the present disclosure.

FIG. 3 depicts a cross-sectional view of a magnetron assembly (magnetron assembly 196) in accordance with some embodiments of the present disclosure. As depicted in FIG. 3, the outer and inner loops of magnets 218, 220 are coupled to a first surface 304 of the shunt plate 202. The encapsulating body 177 is disposed between the shunt plate 202 and the backside 303 of the target assembly 114 (i.e., the backing plate 160). In some embodiments, the backside 303 of the target assembly 114 may include a plurality of grooves 302 to improve the cooling of the target assembly 114.

In operation, coolant flows through the coolant feedthrough channel 183 of the body 154 and into a space between a lowermost surface 305 of the encapsulating body 177 and the backside 303 of the target assembly 114. In some embodiments, the outer and inner magnetic pole plates 214, 216 may be flush with the lowermost surface 305. In some embodiments, the outer and inner magnetic pole plates 214, 216 may alternatively protrude beyond the lowermost surface 305. In some embodiments, the outer and inner magnetic pole plates 214, 216 may alternatively be recessed with respect to the lowermost surface 305. The distance between the lowermost surface 305 and the backside 303 of the target assembly is the distance 163 discussed above (i.e., between about 1 mm and about 2 mm).

The encapsulating body 177 forces to the coolant to flow along the backside 303 of the target assembly (as indicated by flow lines 306) until the coolant reaches the periphery of the magnet assembly 148. Next, the coolant flows up and out of a coolant outlet 308 formed in the source distribution plate 158. Because there are no open spaces between the magnets for the coolant to flow, the coolant is only allowed to flow along the entire backside 303 of the target assembly 114, thus improving the cooling of the target assembly.

Returning to FIG. 1, the substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through an isolation valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in a lower, loading position but rests on the outer periphery of the substrate support 106 when in an upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a desired cross-section. The seal ring 181 may include two opposing planar and generally parallel surfaces to facilitate interfacing with the target assembly 114, such as the backing plate 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 includes the source material 113 to be deposited on a substrate, such as the substrate 108 during sputtering, such as a metal, metal oxide, metal alloy, or the like. In some embodiments, the source material 113 may be titanium, tantalum, tungsten, or the like. In embodiments consistent with the present disclosure, the target assembly 114 includes a backing plate 160 to support the source material 113. The source material 113 may be disposed on a substrate support facing side of the backing plate assembly 160 as illustrated in FIG. 1. The backing plate 160 may comprise a conductive material, such as copper-zinc, copper-chrome, or the same material as the target, such that RF and DC power can be coupled to the source material 113 via the backing plate 160. Alternatively, the backing plate 160 may be non-conductive and may include conductive elements (not shown) such as electrical feedthroughs or the like. The backing plate 160 may be disc shaped, rectangular, square, or any other shape that may be accommodated by the PVD processing system 100. The backing plate 160 is configured to support the source material 113 such that a front surface of the source material opposes the substrate 108 when present. The source material 113 may be coupled to the backing plate 160 in any suitable manner. For example, in some embodiments, the source material 113 may be diffusion bonded to the backing plate 160.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate 160 proximate the peripheral edge of the backing plate 160.

An insulative gap 180 is provided between the grounding plate 156 and the outer surfaces of the source distribution plate 158, the conductive support ring 164, and the target assembly 114. The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 189 to provide additional energy to the target assembly 114 during processing. In some embodiments, the second energy source 189 may be a DC power source to provide DC energy, for example, to enhance a sputtering rate of the target material (and hence, a deposition rate on the substrate). In some embodiments, the second energy source 189 may be a second RF power source, similar to the RF power source 182, to provide RF energy, for example, at a second frequency different than a first frequency of RF energy provided by the RF power source 182. In embodiments where the second energy source 189 is a DC power source, the second energy source may be coupled target assembly 114 in any location suitable to electrically couple the DC energy to the target assembly 114, such as the source distribution plate 158 or some other conductive member.

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods may be stored in the memory 172 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to embodiments of the present disclosure, other and further embodiments of the disclosure may be devised without departing from the basic scope thereof.

The invention claimed is:

1. A magnetron assembly, comprising:
a rotatable magnet assembly having a plurality of magnets spaced apart from each other wherein the plurality of magnets include an outer loop of magnets; and
an encapsulating body disposed in a space between the plurality of magnets, wherein the encapsulating body includes a plurality of holes therethrough corresponding to the plurality of magnets, wherein the encapsulating body is thicker radially inward of the outer loop of magnets than a region radially outward of the outer loop of magnets.

2. The magnetron assembly of claim 1, further comprising:
a body extending along a central axis of the magnetron assembly and having a coolant feedthrough channel to provide a coolant to an area beneath the body, wherein the rotatable magnet assembly is coupled to a bottom of the body.

3. The magnetron assembly of claim 2, wherein the encapsulating body includes a through hole extending through the encapsulating body and aligned with the coolant feedthrough channel.

4. The magnetron assembly of claim 1, wherein the encapsulating body has an overall thickness approximately equal to that of the of the plurality of magnets.

5. The magnetron assembly of claim 1, wherein the rotatable magnet assembly comprises:
a shunt plate, wherein the plurality of magnets are coupled to a first surface of the shunt plate, wherein the plurality of magnets includes an outer loop of magnets and an inner loop of magnets, and wherein the space is within the inner loop of magnets and between the outer loop of magnets and the inner loop of magnets.

6. The magnetron assembly of claim 5, further comprising:
an outer magnetic pole plate having a shape corresponding to the outer loop of magnets and coupled to the outer loop of magnets; and
an inner magnetic pole plate having a shape corresponding to the inner loop of magnets and coupled to the inner loop of magnets, wherein the encapsulating body includes an outer pole plate channel corresponding with the shape of the outer magnetic pole plate and an inner pole plate channel corresponding with the shape of the inner magnetic pole plate.

7. The magnetron assembly of claim 5, further comprising:
a counterbalance coupled to the shunt plate to provide a counterweight as the rotatable magnet assembly rotates.

8. The magnetron assembly of claim 1, wherein the encapsulating body is formed of a non-ferrous material.

9. The magnetron assembly of claim 8, wherein the encapsulating body is formed of one of polyoxymethylene, epoxy, or a foam epoxy hybrid.

10. A substrate processing system, comprising:
a chamber;
a lid removably disposed atop the chamber;
a target assembly coupled to the lid, the target assembly including a target material to be sputtered from the target assembly and deposited on a substrate;
a substrate support disposed within the chamber to support a substrate during processing;
a coolant supply; and
a magnetron assembly comprising a rotatable magnet assembly having a plurality of magnets spaced apart from each other wherein the plurality of magnets includes an outer loop of magnets; and an encapsulating body disposed in a space between the plurality of magnets, wherein the encapsulating body includes a plurality of holes therethrough corresponding to the plurality of magnets, wherein the encapsulating body is thicker radially inward of the outer loop of magnets than a region radially outward of the outer loop of magnets and further comprising a body extending along a central axis of the magnetron assembly and having a coolant feedthrough channel to provide a coolant to an area beneath the body, wherein the rotatable magnet assembly is coupled to a bottom of the body disposed adjacent the target assembly on a side opposite the substrate support, wherein the coolant feedthrough channel is configured to provide the coolant from the coolant supply to a gap between the encapsulating body and the target assembly to cool the target assembly.

11. The substrate processing system of claim 10, further comprising:
a first motor coupled to the body via a coupling assembly to rotate the body and the rotatable magnet assembly.

12. The substrate processing system of claim 10, wherein the target assembly includes a backing plate and a target coupled to the backing plate, and wherein a side of the backing plate adjacent the magnet assembly includes a plurality of grooves.

13. The substrate processing system of claim 10, wherein the rotatable magnet assembly comprises:
   a shunt plate, wherein the plurality of magnets are coupled to a first surface of the shunt plate, wherein the plurality of magnets includes an outer loop of magnets and an inner loop of magnets, and wherein the space is within the inner loop of magnets and between the outer loop of magnets and the inner loop of magnets.

14. The substrate processing system of claim 13, further comprising:
   an outer magnetic pole plate having a shape corresponding to the outer loop of magnets and coupled to the outer loop of magnets, and
   an inner magnetic pole plate having a shape corresponding to the inner loop of magnets and coupled to the inner loop of magnets, wherein the encapsulating body includes an outer pole plate channel corresponding with the shape of the outer magnetic pole plate and an inner pole plate channel corresponding with the shape of the inner magnetic pole plate.

15. The substrate processing system of claim 10, wherein the encapsulating body includes a through hole extending through the encapsulating body and aligned with the coolant feedthrough channel.

16. A magnetron assembly, comprising:
   a body extending along a central axis of the magnetron assembly and having a coolant feedthrough channel to provide a coolant to an area beneath the body;
   a rotatable magnet assembly coupled to a bottom of the body, the rotatable magnet assembly having a shunt plate, an outer loop of magnets coupled to a first surface of the shunt plate, and an inner loop of magnets coupled to the first surface of the shunt plate; and
   an encapsulating body disposed in a space between within the inner loop of magnets and between the outer loop of magnets and the inner loop of magnets, wherein the encapsulating body includes a through hole aligned with the coolant feedthrough channel, wherein the encapsulating body is thicker radially inward of the outer loop of magnets than a region radially outward of the outer loop of magnets.

17. The magnetron assembly of claim 16, further comprising:
   an outer magnetic pole plate having a shape corresponding to the outer loop of magnets and coupled to the outer loop of magnets; and
   an inner magnetic pole plate having a shape corresponding to the inner loop of magnets and coupled to the inner loop of magnets, wherein the encapsulating body includes an outer pole plate channel corresponding with the shape of the outer magnetic pole plate and an inner pole plate channel corresponding with the shape of the inner magnetic pole plate.

18. The magnetron assembly of claim 16, wherein bottom surfaces of ones of the plurality of magnets are either substantially coplanar with or recessed with respect to a bottom surface of the encapsulating body.

19. The magnetron assembly of claim 16, wherein the encapsulating body is formed of a non-ferrous material.

20. The magnetron assembly of claim 19, wherein the encapsulating body is formed of one of polyoxymethylene, epoxy, or a foam epoxy hybrid.

* * * * *